United States Patent
Chang et al.

(10) Patent No.: US 9,305,941 B2
(45) Date of Patent: Apr. 5, 2016

(54) DEVICE AND METHOD FOR IMPROVING AMOLED DRIVING

(71) Applicant: APPLE INC., Cupertino, CA (US)

(72) Inventors: Shih Chang Chang, Cupertino, CA (US); Yu Cheng Chen, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 127 days.

(21) Appl. No.: 13/667,942

(22) Filed: Nov. 2, 2012

(65) Prior Publication Data
US 2014/0125565 A1    May 8, 2014

(51) Int. Cl.
*G09G 3/30* (2006.01)
*H01L 27/12* (2006.01)

(52) U.S. Cl.
CPC ................ *H01L 27/1237* (2013.01)

(58) Field of Classification Search
CPC ....... H01L 21/20; H01L 21/44; H01L 21/336; H01L 29/12; H01L 29/786; H01L 33/00; H01L 51/50
USPC ............ 257/40, 43, 89, 314, 71, 72; 438/104, 438/761; 345/76, 77, 82, 83, 92; 313/463, 313/483; 315/169
See application file for complete search history.

(56) References Cited

U.S. PATENT DOCUMENTS

| | | | |
|---|---|---|---|
| 6,583,471 B1 * | 6/2003 | Yamazaki et al. | 257/350 |
| 7,250,930 B2 | 7/2007 | Hoffman et al. | |
| 7,906,229 B2 | 3/2011 | Goyal | |
| 7,977,868 B2 | 7/2011 | Shieh et al. | |
| 2002/0030647 A1 | 3/2002 | Hack et al. | |
| 2004/0207001 A1 * | 10/2004 | Kouznetsov et al. | 257/314 |
| 2009/0159894 A1 * | 6/2009 | Yasumatsu | 257/72 |
| 2010/0001285 A1 * | 1/2010 | Chen | 257/72 |
| 2010/0244003 A1 * | 9/2010 | Abe et al. | 257/40 |
| 2011/0108837 A1 * | 5/2011 | Yamazaki et al. | 257/43 |
| 2011/0156026 A1 * | 6/2011 | Yamazaki et al. | 257/43 |
| 2013/0207117 A1 * | 8/2013 | An et al. | 257/71 |

* cited by examiner

*Primary Examiner* — Lun-Yi Lao
*Assistant Examiner* — Johny Lau
(74) *Attorney, Agent, or Firm* — Fletcher Yoder PC

(57) ABSTRACT

Devices and methods for increasing the aperture ratio and providing more precise gray level control to pixels in an active matrix organic light emitting diode (AMOLED) display are provided. By way of example, one embodiment includes disposing a gate insulator and an interlayer dielectric material between a gate electrode of a thin-film transistor of a driving circuit and a channel of the thin-film transistor. The improved structure of the driving circuit facilitates a higher voltage range for controlling the gray level of the pixels, and may increase the aperture ratio of the pixels.

24 Claims, 7 Drawing Sheets

DEVICE AND METHOD FOR IMPROVING AMOLED DRIVING

BACKGROUND

The present disclosure relates generally to electronic displays and, more particularly, to devices and methods for achieving more precise gray level control and an increased aperture ratio in active matrix organic light emitting diode (AMOLED) electronic displays.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Flat panel displays, such as AMOLED displays, are commonly used in a wide variety of electronic devices, including such consumer electronics as televisions, computers, and handheld devices (e.g., cellular telephones, audio and video players, gaming systems, and so forth). Such display panels typically provide a flat display in a relatively thin package that is suitable for use in a variety of electronic goods. In addition, such devices may use less power than comparable display technologies, making them suitable for use in battery-powered devices or in other contexts where it is desirable to minimize power usage.

AMOLED displays typically include picture elements (e.g. pixels) arranged in a matrix to display an image that may be viewed by a user. Individual pixels of an AMOLED display may generate light as a voltage is applied to each pixel. The voltage applied to a pixel of an AMOLED display may be regulated by two thin film transistors (TFTs). For example, a circuit switching TFT may be used to regulate current flowing into a storage capacitor, and a driving TFT may be used to regulate the voltage being provided to the OLED of an individual pixel. Connections between the TFTs in an AMOLED display may extend through an area of the pixel that may otherwise be used for displaying image data. In certain configurations, a pixel aperture ratio is a ratio between a transparent area of the pixel that can be used to display image data and a total area of the pixel. Thus, connections between the TFTs may decrease the area of a pixel that can be used to display image data and thereby lower the aperture ratio of pixels of the AMOLED display.

In electronic displays, the gray level of each pixel may determine the intensity of the output of the pixel. In certain displays, the intensity of each pixel's output may vary from black at the lowest intensity to white at the highest intensity. As mentioned above, one of the TFTs of an AMOLED display may regulate a voltage being provided to the OLED of an individual pixel. The range of voltages that is applied to a gate electrode of the driving TFT may determine the amount of current flowing to the OLED and thus, the gray scale level of a pixel. An increased range of voltages that may be applied to the gate of the driving TFT may give more precise control over the gray level in an AMOLED display.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to devices and methods for increasing the aperture ratio and the gray level control of pixels of an AMOLED display. For example, a display for an electronic device may include a driving thin film transistor (TFT) having a first source, a first drain, a first channel, and a first gate electrode. Additionally, a circuit switching TFT may include a second source, a second drain, a second channel, and a second gate electrode. A gate insulator layer may be disposed over the first source, the first drain, and the first channel of the driving TFT, and the second source, the second drain, and the second channel of the circuit switching TFT. The second gate electrode of the circuit switching TFT may be disposed over the gate insulating layer. An interlayer dielectric (ILD) may be disposed over the gate insulating layer and the second gate electrode of the circuit switching TFT. The first gate electrode of the driving TFT may be disposed over the ILD. Disposing the first gate electrode over the ILD may allow a direct electrical connection to the second source of the circuit switching TFT. This direct connection may decrease an area occupied by the connection circuitry mentioned above. Moreover, because the area of the direct connection is reduced, the pixel aperture ratio of pixels of the display may be increased. Additionally, disposing the gate electrode over the ILD rather than over the gate insulator layer produces a larger separation between the gate electrode and the channel of the driving TFT. The larger separation may increase the voltage range applied to the gate electrode and improve the gray level control.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, present embodiments relate to electronic displays, particularly to active matrix organic light emitting diode (AMOLED) displays. In particular, present embodiments include devices to increase the aperture ratio of pixels and the gray level control of pixels of an AMOLED display. Additionally, present embodiments include methods for fabricating AMOLED displays that have increased pixel aperture ratios. The pixel aperture ratios may be increased by reducing the area of connection circuitry within pixels of a display. Moreover, present embodiments include methods for fabricating AMOLED displays that have increased gray level control of pixels. The gray level control of pixels may be increased by increasing the distance between a gate electrode and a channel of a driving TFT.

Figure 1:
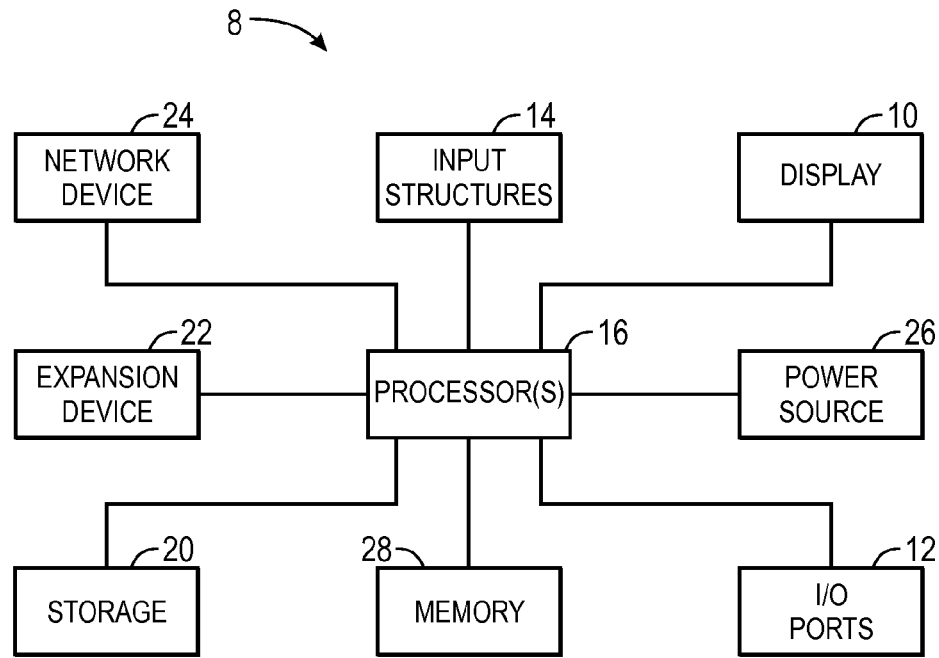
FIG. 1 is a block diagram of exemplary components of an electronic device which may include a driving thin film transistor (TFT), in accordance with an embodiment of the disclosure.
Figure 3:
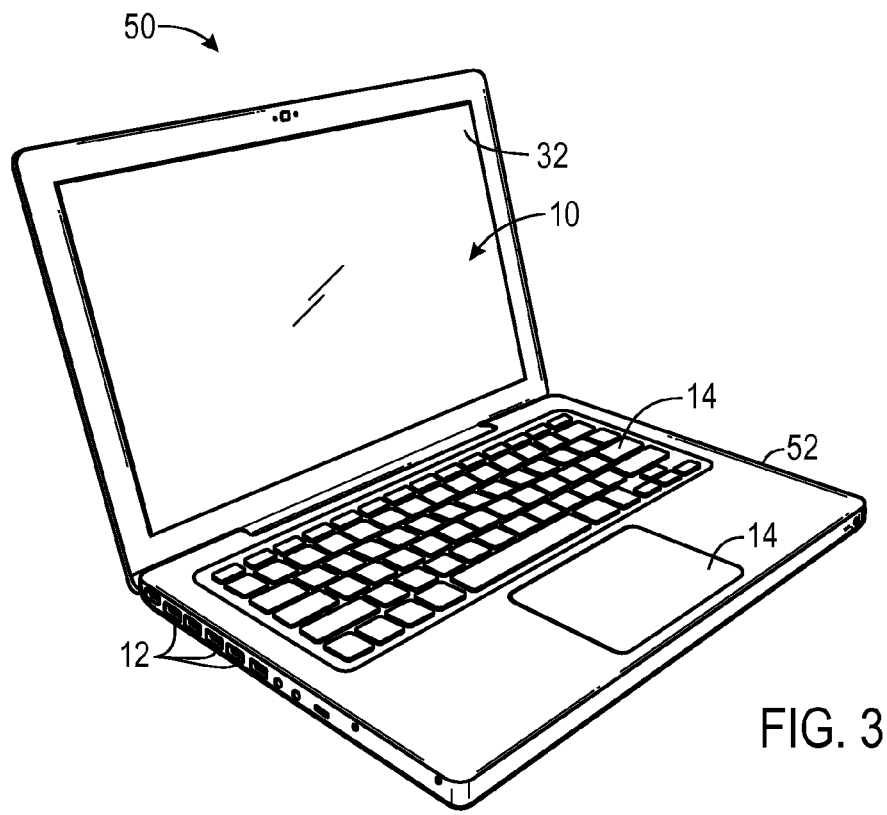
FIG. 3 is a perspective view of a notebook computer, in accordance with an embodiment of the disclosure.
Figure 2:
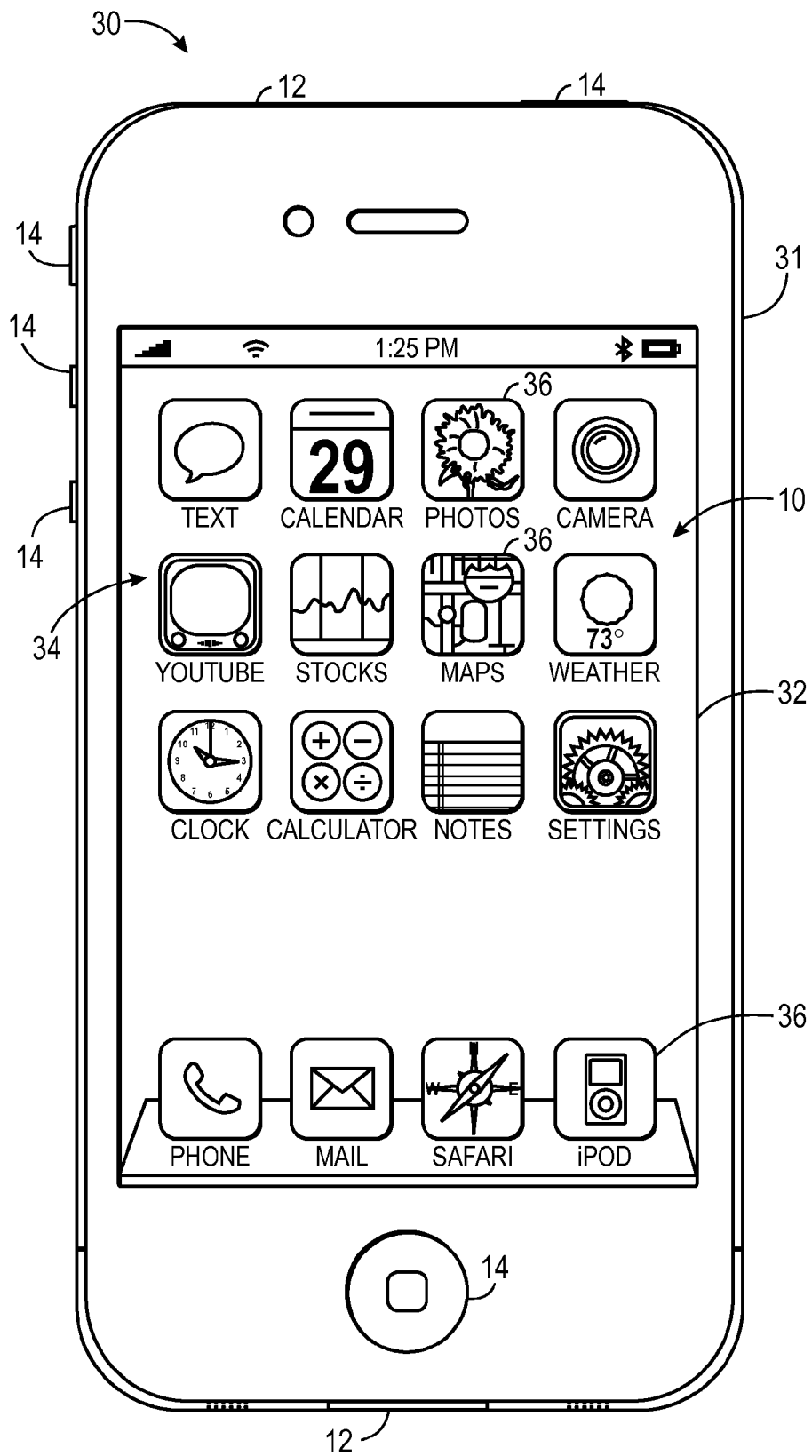
FIG. 2 is a front view of a handheld electronic device, in accordance with an embodiment of the disclosure.

With the foregoing in mind, a general description of suitable electronic devices that may employ electronic displays having pixels with improved gray level control and a larger pixel aperture ratio is described below. In particular, FIG. 1 is a block diagram depicting various components that may be present in an electronic device suitable for use with such a display. FIGS. 2 and 3 respectively illustrate perspective and front views of a suitable electronic device, which may be, as illustrated, a notebook computer or a handheld electronic device.

FIG. 1 is a block diagram illustrating the components that may be present in such an electronic device 8 and which may allow the device 8 to function in accordance with the techniques discussed herein. Those of ordinary skill in the art will appreciate that the various functional blocks shown in FIG. 1 may comprise hardware elements (including circuitry), software elements (including computer code stored on a computer-readable medium) or a combination of both hardware and software elements. It should further be noted that FIG. 1 is merely one example of a particular implementation and is merely intended to illustrate the types of components that may be present in a device 8. For example, in the presently illustrated embodiment, these components may include a display 10, I/O ports 12, input structures 14, one or more processors 16, a memory device 18, a non-volatile storage 20, expansion card(s) 22, a networking device 24, and a power source 26. As will be appreciated, the overall quality of image data shown on the display 10 may be affected by the controllability of gray levels and aperture ratios of the pixels of the display 10.

With regard to each of these components, the display 10 may be used to display various images generated by the device 8. Specifically, in certain embodiments, the display 10 may be an AMOLED display. Additionally, in certain embodiments of the electronic device 8, the display 10 may be provided in conjunction with a touch-sensitive element, such as a touch screen, that may be used as part of the control interface for the device 8.

The I/O ports 12 may include ports configured to connect to a variety of external devices, such as a power source, headset or headphones, or other electronic devices (e.g., such as handheld devices and/or computers, printers, projectors, external displays, modems, docking stations, and so forth). The I/O ports 12 may support any suitable interface type, such as a universal serial bus (USB) port, a video port, a serial connection port, an IEEE-1394 port, an Ethernet or modem port, and/or an AC/DC power connection port.

The input structures 14 may include the various devices, circuitry, and pathways by which user input or feedback is provided to the processor 16. Such input structures 14 may be configured to control a function of the device 8, applications running on the device 8, and/or any interfaces or devices connected to or used by the electronic device 8. For example, the input structures 14 may allow a user to navigate a displayed user interface or application interface. Examples of the input structures 14 may include buttons, sliders, switches, control pads, keys, knobs, scroll wheels, keyboards, mice, touchpads, and so forth.

In certain embodiments, an input structure 14 and display 10 may be provided together, such as in the case of a touch-screen where a touch sensitive mechanism is provided in conjunction with the display 10. In such embodiments, the user may select or interact with displayed interface elements via the touch sensitive mechanism. In this way, the displayed interface may provide interactive functionality, allowing a user to navigate the displayed interface by touching the display 10.

User interaction with the input structures 14, such as to interact with a user or application interface displayed on the display 10, may generate electrical signals indicative of the user input. These input signals may be routed via suitable pathways, such as an input hub or bus, to the processor(s) 16 for further processing.

The processor(s) 16 may provide the processing capability to execute the operating system, programs, user and application interfaces, and any other functions of the electronic device 8. The processor(s) 16 may include one or more microprocessors, such as one or more "general-purpose" microprocessors, one or more special-purpose microprocessors and/or ASICS, or some combination of such processing components. For example, the processor 16 may include one or more reduced instruction set (RISC) processors, as well as graphics processors, video processors, audio processors, and/or related chip sets.

The instructions or data to be processed by the processor(s) 16 may be stored in a computer-readable medium, such as a memory 18. Such a memory 18 may be provided as a volatile memory, such as random access memory (RAM), and/or as a non-volatile memory, such as read-only memory (ROM). The memory 18 may store a variety of information and may be used for various purposes. For example, the memory 18 may store firmware for the electronic device 8 (e.g., such as a basic input/output instruction or operating system instructions), various programs, applications, or routines executed on the electronic device 8, user interface functions, processor functions, and so forth. In addition, the memory 18 may be used for buffering or caching during operation of the electronic device 8.

The components may further include other forms of computer-readable media, such as a non-volatile storage 20, for persistent storage of data and/or instructions. The non-volatile storage 20 may include flash memory, a hard drive, or any other optical, magnetic, and/or solid-state storage media. The non-volatile storage 20 may be used to store firmware, data files, software, wireless connection information, and any other suitable data.

The embodiment illustrated in FIG. 1 may also include one or more card or expansion slots. The card slots may be configured to receive an expansion card 22 that may be used to add functionality, such as additional memory, I/O functionality, or networking capability, to the electronic device 8. Such an expansion card 22 may connect to the device through any type of suitable connector, and may be accessed internally or external to the housing of the electronic device 8. For example, in one embodiment, the expansion card 22 may be a flash memory card, such as a SecureDigital (SD) card, mini- or microSD, CompactFlash card, Multimedia card (MMC), or the like.

The components depicted in FIG. 1 also include a network device 24, such as a network controller or a network interface card (NIC). In one embodiment, the network device 24 may be a wireless NIC providing wireless connectivity over any 802.11 standard or any other suitable wireless networking standard. The network device 24 may allow the electronic device 8 to communicate over a network, such as a Local Area Network (LAN), Wide Area Network (WAN), or the Internet. Further, the electronic device 8 may connect to and send or receive data with any device on the network, such as portable electronic devices, personal computers, printers, and so forth. Alternatively, in some embodiments, the electronic device 8 may not include a network device 24. In such an embodiment, a NIC may be added as an expansion card 22 to provide similar networking capability as described above.

Further, the components may also include a power source 26. In one embodiment, the power source 26 may be one or more batteries, such as a lithium-ion polymer battery or other type of suitable battery. The battery may be user-removable or may be secured within the housing of the electronic device 8, and may be rechargeable. Additionally, the power source 26 may include AC power, such as power provided by an electrical outlet, and the electronic device 8 may be connected to the power source 26 via a power adapter. This power adapter may also be used to recharge one or more batteries if present.

With the foregoing in mind, FIG. 2 illustrates an electronic device 8 in the form of a handheld device 30, here a cellular telephone. It should be noted that while the depicted handheld device 30 is provided in the context of a cellular telephone, other types of handheld devices (e.g., such as media players for playing music and/or video, personal data organizers, handheld game platforms, and/or combinations of such devices) may also be suitably provided as the electronic device 8. Further, a suitable handheld device 30 may incorporate the functionality of one or more types of devices, such as a media player, a cellular phone, a gaming platform, a personal data organizer, and so forth.

For example, in the depicted embodiment, the handheld device 30 is in the form of a cellular telephone that may provide various additional functionalities (such as the ability to take pictures, record audio and/or video, listen to music, play games, and so forth). As discussed with respect to the general electronic device of FIG. 1, the handheld device 30 may allow a user to connect to and communicate through the Internet or through other networks, such as LANs or WANs. The handheld electronic device 30, may also communicate with other devices using short-range connections, such as Bluetooth and near field communication. By way of example, the handheld device 30 may be a model of an iPod®, iPhone®, or iPad® available from Apple Inc. of Cupertino, Calif.

In the depicted embodiment, the handheld device 30 includes an enclosure or body 31 that protects the interior components from physical damage and shields them from electromagnetic interference. The enclosure 31 may be formed from any suitable material such as plastic, metal or a composite material and may allow certain frequencies of electromagnetic radiation to pass through to wireless communication circuitry within the handheld device 30 to facilitate wireless communication.

In the depicted embodiment, the enclosure 31 includes user input structures 14 through which a user may interface with the device. Each user input structure 14 may be configured to help control a device function when actuated. For example, in a cellular telephone implementation, one or more of the input structures 14 may be configured to invoke a "home" screen or menu to be displayed, to toggle between a sleep and a wake mode, to silence a ringer for a cell phone application, to increase or decrease a volume output, and so forth.

In the depicted embodiment, the handheld device 30 includes a display 10 in the form of an AMOLED display 32. The AMOLED display 32 may be used to display a graphical user interface (GUI) 34 that allows a user to interact with the handheld device 30. The GUI 34 may include various layers, windows, screens, templates, or other graphical elements that may be displayed in all, or a portion, of the display 10. Generally, the GUI 34 may include graphical elements that represent applications and functions of the handheld device 30. The graphical elements may include icons 36 and other images representing buttons, sliders, menu bars, and the like. The icons 36 may correspond to various applications of the handheld device 30 that may open upon selection of a respective icon 36. Furthermore, selection of an icon 36 may lead to a hierarchical navigation process, such that selection of an icon 36 leads to a screen that includes one or more additional icons or other GUI elements. The icons 36 may be selected via a touch screen included in the display 10, or may be selected by a user input structure 14, such as a wheel or button.

The handheld electronic device 30 also may include various input and output (I/O) ports 12 that allow connection of the handheld device 30 to external devices. For example, one I/O port 12 may be a port that allows the transmission and reception of data or commands between the handheld electronic device 30 and another electronic device, such as a computer. Such an I/O port 12 may be a proprietary port from Apple Inc. or may be an open standard I/O port.

In addition to handheld devices 30, such as the depicted cellular telephone of FIG. 2, an electronic device 8 may also take the form of a computer or other type of electronic device. Such computers may include computers that are generally portable (such as laptop, notebook, and tablet computers) as well as computers that are generally used in one place (such as conventional desktop computers, workstations and/or servers). In certain embodiments, the electronic device 8 in the form of a computer may be a model of a MacBook®, MacBook® Pro, MacBook Air®, iMac®, Mac® mini, Mac Pro®, or iPad® available from Apple Inc. By way of example, an electronic device 8 in the form of a laptop computer 50 is illustrated in FIG. 3 in accordance with one embodiment. The depicted computer 50 includes a housing 52, a display 10 (e.g., the AMOLED display 32), input structures 14, and input/output ports 12.

In one embodiment, the input structures 14 (such as a keyboard and/or touchpad) may be used to interact with the computer 50, such as to start, control, or operate a GUI or applications running on the computer 50. For example, a keyboard and/or touchpad may allow a user to navigate a user interface or application interface displayed on the display 10.

As depicted, the electronic device 8 in the form of computer 50 may also include various input and output ports 12 to allow connection of additional devices. For example, the computer 50 may include an I/O port 12, such as a USB port or other port, suitable for connecting to another electronic device, a projector, a supplemental display, and so forth. In addition, the computer 50 may include network connectivity, memory, and storage capabilities, as described with respect to FIG. 1. As a result, the computer 50 may store and execute a GUI and other applications.

It should be noted that the electronic device 8 having the presently disclosed display 10 may include devices other than those discussed as examples. Further, the electronic device may also include any device having a display 10 such as a television, a stand-alone display device, and so forth.

Figure 4:
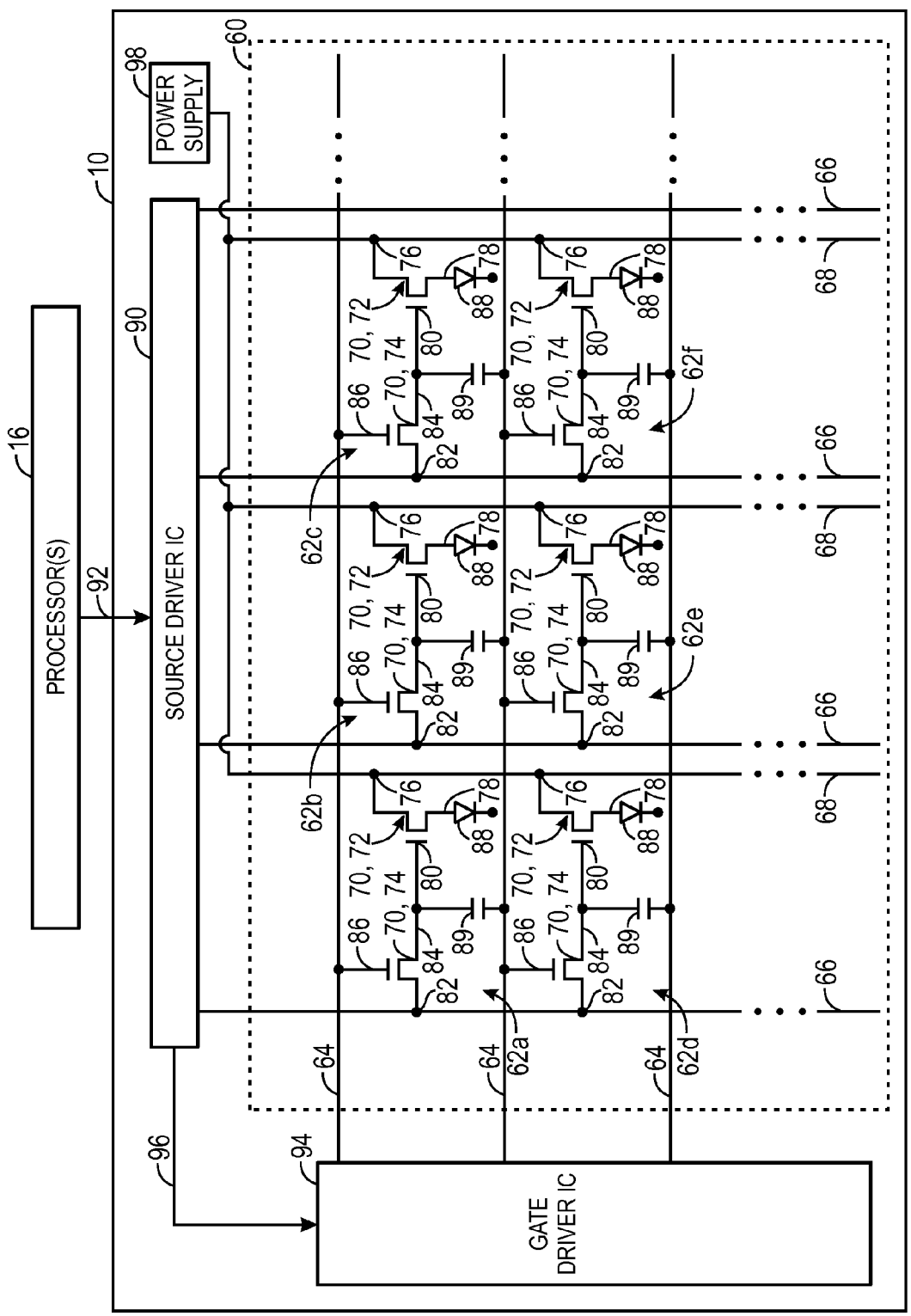
FIG. 4 is a circuit diagram illustrating a portion of a matrix of unit pixels of the display device of FIG. 1, in accordance with an embodiment of the disclosure.

As mentioned, the display 10 of the electronic device may be an AMOLED display 32. The AMOLED display 32 includes a matrix of pixels that contain light emitting circuitry. Accordingly, FIG. 4 illustrates circuitry including a portion of a matrix of pixels of the display 10. As illustrated, the display 10 may include a display panel 60. Moreover, the display panel 60 may include multiple unit pixels 62 arranged as an array or matrix defining multiple rows and columns of unit pixels 62 that collectively form a viewable region of the display 10 in which an image may be displayed. In such an array, each unit pixel 62 may be defined by the intersection of rows and columns, represented here by the illustrated gate lines 64 (also referred to as "scanning lines") and source lines 66 (also referred to as "data lines"), respectively. Additionally, power supply lines 68 may provide power to each of the unit pixels 62.

Although only six unit pixels, referred to individually by reference numbers 62a-62f, respectively, are shown, it should be understood that in an actual implementation, each source line 66 and gate line 64 may include hundreds or even thousands of such unit pixels 62. By way of example, in a color display panel 60 having a display resolution of 1024×768, each source line 66, which may define a column of the pixel array, may include 768 unit pixels, while each gate line 64, which may define a row of the pixel array, may include 1024 groups of unit pixels with each group including a red, blue, and green pixel, thus totaling 3072 unit pixels per gate line 64. By way of further example, the panel 60 may have a resolution of 480×320 or 960×640. In the presently illustrated example, the unit pixels 62a-62c may represent a group of pixels having a red pixel (62a), a blue pixel (62b), and a green pixel (62c). The group of unit pixels 62d-62f may be arranged in a similar manner. Additionally, in the industry, it is also common for the term "pixel" may refer to a group of adjacent different-colored pixels (e.g., a red pixel, blue pixel, and green pixel), with each of the individual colored pixels in the group being referred to as a "sub-pixel."

Each unit pixel 62a-62f shown in FIG. 4 includes two thin-film transistors (TFTs) 70, a driving TFT 72 and a circuit switching TFT 74. The driving TFT 72 may include a source 76, a drain 78, and a gate 80. Likewise, the circuit switching TFT 74 may include a source 82, a drain 84, and a gate 86. In the illustrated embodiment, the source 76 of each driving TFT 72 may be electrically coupled to a power supply line 68. Similarly, the drain 78 of each driving TFT 72 may be electrically connected to an organic light emitting diode (OLED) 88. Furthermore, the source 82 of each circuit switching TFT 74 may be electrically connected to a source line 66, while the drain 84 of each circuit switching TFT 74 may be electrically connected to the gate 80 of each driving TFT 72. A gate 86 of each circuit switching TFT 74 may be electrically connected to a gate line 64. Each TFT 70 serves as a switching element and may be activated and deactivated (e.g., switched on and off) for a predetermined period based upon the respective presence or absence of a gate activation signal (also referred to as a scanning signal) at the gates of the TFTs 70. Furthermore, a storage capacitor 89 may be electrically connected to a drain 84 of each circuit switching TFT 74 and a gate line 64 of a different unit pixel 62.

The display 10 also includes a source driver integrated circuit (IC) 90, which may include a chip, such as a processor or ASIC, configured to control various aspects of the display 10 and panel 60. For example, the source driver IC 90 may receive image data 92 from the processor(s) 16 and send corresponding image signals to the unit pixels 62 of the panel 60. The source driver IC 90 may also be coupled to a gate driver IC 94, which may be configured to provide/remove gate activation signals to activate/deactivate rows of unit pixels 62 via the gate lines 64. The source driver IC 90 may include a timing controller that determines and sends timing information 96 to the gate driver IC 94 to facilitate activation and deactivation of individual rows of unit pixels 62. In other embodiments, timing information may be provided to the gate driver IC 94 in some other manner (e.g., using a timing controller that is separate from the source driver IC 90). Further, while FIG. 4 depicts only a single source driver IC 90, it should be appreciated that other embodiments may utilize multiple source driver ICs 90 to provide image signals 96 to the unit pixels 62. For example, additional embodiments may include multiple source driver ICs 90 disposed along one or more edges of the panel 60, with each source driver IC 90 being configured to control a subset of the source lines 66 and/or gate lines 64.

In operation, the source driver IC 90 receives image data 92 from the processor 16 or a discrete display controller and, based on the received data, outputs signals to control the unit pixels 62. For instance, to display image data 92, the source driver IC 90 and the gate driver IC 94 may respectively supply voltage to the source 82 and gate 86 of the circuit switching TFT 74 to charge each storage capacitor 89. The storage capacitor 89 may drive the gate 80 of the driving TFT 72 to provide a current from the power supply 98 to the OLED 88 of each unit pixel 62. As may be appreciated, the color of a particular unit pixel depends on the color of the corresponding OLED 88. The above-described process may be repeated for each row of pixels 62 in the panel 60 to reproduce image data 92 as a viewable image on the display 10.

Figure 5:
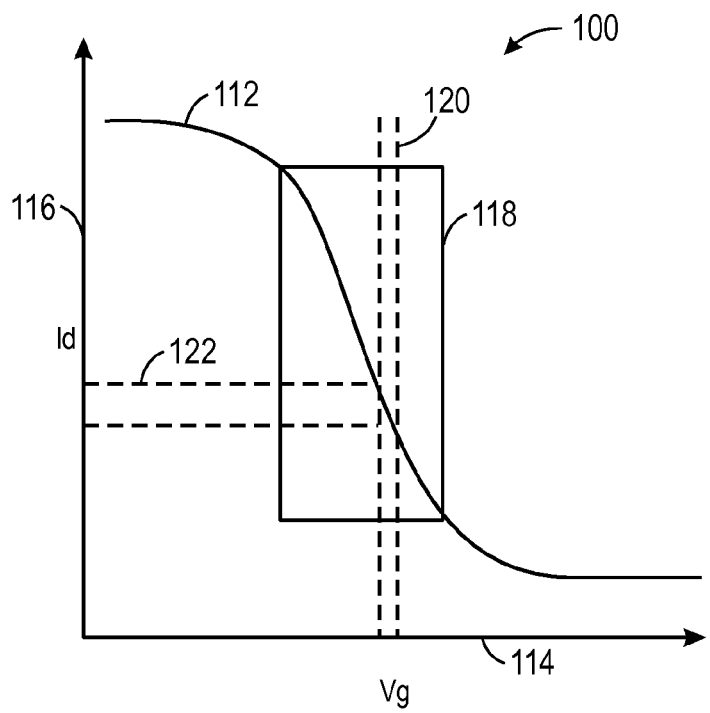
FIG. 5 is a graph depicting a relationship between a gate voltage and a drain current for the TFT of an active matrix organic light emitting diode (AMOLED) display, in accordance with an embodiment of the disclosure.

As mentioned above, pixels of the display 10 contain TFTs to drive and control the current being supplied to the display circuitry. FIG. 5 is a graph 110 depicting a curve 112 for driving a TFT in a display 10. The x-axis of the graph 110 represents a gate voltage 114 of the driving TFT 72. The y-axis of the graph 110 represents a drain current 116 of the driving TFT 74. A box 118 on the graph 110 shows the TFT gate voltage operation range. A larger gate voltage operation range may facilitate improved control of the gray level of each pixel in the display 10. Additionally, a larger gate voltage operation range for a given current range may decrease the slope of the curve 112. When the slope of the curve 112 decreases, a same gate voltage variation 120 may cause a smaller drain current difference 122, thereby facilitating improved control of the gray level of each pixel in a display 10.

Figure 6:
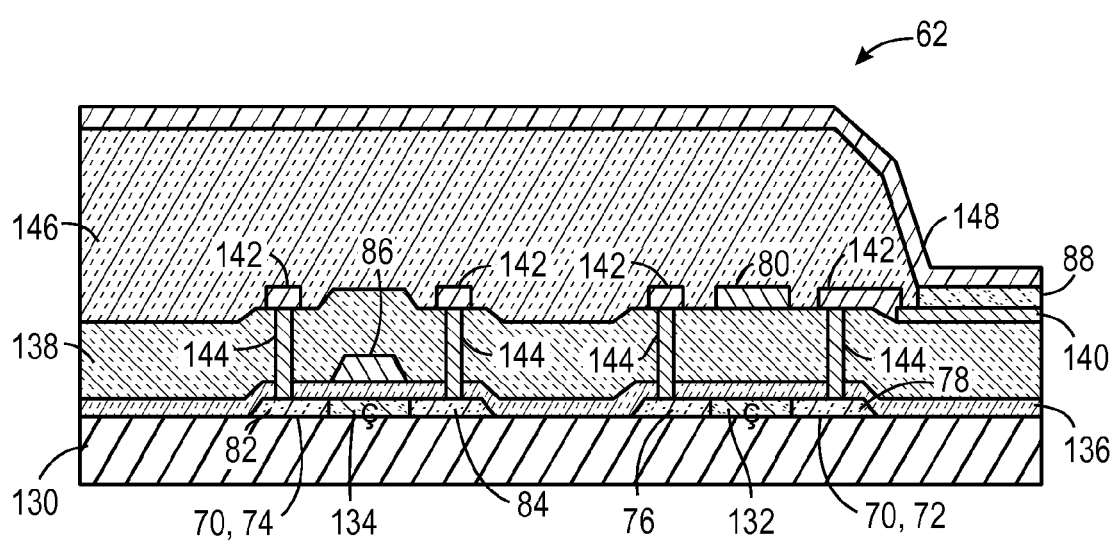
FIG. 6 is a cross-sectional view of a portion of an AMOLED display having a driving TFT, in accordance with an embodiment of the disclosure.
Figure 7:
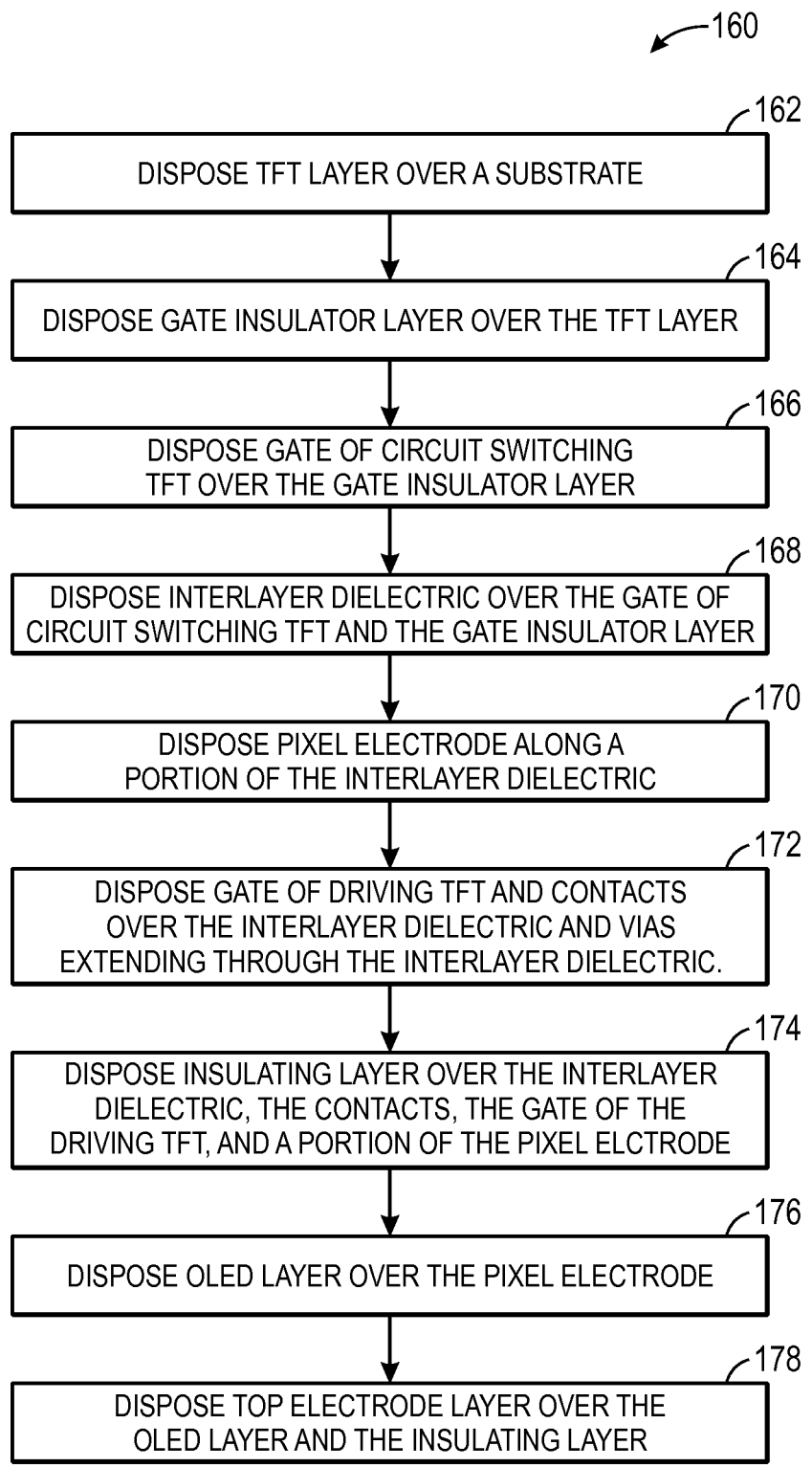
FIG. 7 is a flowchart of a process for manufacturing an AMOLED unit pixel for use in a display, in accordance with an embodiment of the disclosure.

The display 10 may be manufactured to facilitate greater control of gray levels of pixels and to increase the aperture ratio of pixels. Accordingly, FIG. 6 illustrates a cross-sectional view of a unit pixel 62 of such a display 10. The cross-sectional view of FIG. 6 will be discussed in conjunction with FIG. 7. FIG. 7 illustrates a flowchart 160 of a process for manufacturing the unit pixel 62 of FIG. 6. The unit pixel 62 may be formed from several layers. Specifically, the unit pixel 62 may include a substrate 130, and one or more thin-film transistor (TFT) layers disposed on the substrate 130, as represented by block 162 of FIG. 7. In the embodiment illustrated in FIG. 6, the unit pixel 62 includes the driving TFT 72 and the circuit switching TFT 74. The driving TFT 72 includes the source 76, a channel 132, the drain 78, and the gate 80. Moreover, the circuit switching TFT 74 includes the source 82, a channel 134, the drain 84, and the gate 86. In some embodiments, the unit pixel 62 may include more than one driving TFT 72 and/or more than one circuit switching TFT 74. As illustrated, a gate insulator layer 136 is disposed over the source 76, the channel 132, and the drain 78 of the driving TFT 72. Further, the gate insulator layer 136 is disposed over the source 82, the channel 134, and the drain 84 of the circuit switching TFT 74, as represented by block 164 of FIG. 7. The gate insulator layer 136 may insulate the channel 134 of the circuit switching TFT 74 from the gate 86 of the circuit switching TFT 74.

As illustrated in FIG. 6 and represented by block 166 of FIG. 7, the gate 86 of the circuit switching TFT 74 is disposed over the gate insulator layer 136 of the circuit switching TFT 74 to control current flow through the channel 134 of the circuit switching TFT 74. An interlayer dielectric (ILD) 138 is disposed over the gate 86 and the gate insulator layer 136, as represented by block 168 of FIG. 7. A pixel electrode 140 may be disposed along a portion of the ILD 138, as represented by block 170 of FIG. 7. The pixel electrode 140 may be electrically coupled to the drain 78 of the driving TFT 72 by a contact 142 and a via 144. One or more contacts 142 are disposed over the ILD 138 and electrically coupled to the source 76, the source 82, the drain 78, and the drain 84 by respective vias 144 extending through the ILD 138 and the gate insulator layer 136. The gate 80 of the driving TFT 72 is disposed over the ILD 138 directly above the channel 132 of the driving TFT 72 to control current flow through the channel 132 of the driving TFT 72. The vias 144, contacts 142, and gate 80 of the driving TFT 72 may be disposed in a single manufacturing step, as represented by block 172 of FIG. 7.

The gate 80 of the driving TFT 72 is disposed over the ILD 138 and directly above the channel 132 of the driving TFT 72 to provide better voltage control of the driving TFT 72. A greater distance between the gate 80 of the driving TFT 72 and the channel 132 of the driving TFT 72 may decrease the capacitance formed between the gate 80 and the channel 132 of the driving TFT 72. This decreased capacitance between the gate 80 and the channel 132 of the driving TFT 72 may use a larger range of voltages applied to the gate 80 to cause a corresponding range of currents to flow through the channel 132 of the driving TFT 72. A large range of possible input voltages may provide more precise voltage and current control. Moreover, better voltage and current control may provide more accurate gray level control.

As represented by block 174 of FIG. 7, an insulating layer 146, such as an organic planarization layer, may be disposed over the ILD 138, the contacts 142, the first gate electrode 80 of the driving TFT 72, and a portion of the pixel electrode 140. The OLED 88 (e.g. an OLED layer) may be disposed directly over the pixel electrode 140, as represented by block 176 in FIG. 7. In the present embodiment, the display 10 may be a bottom emission display. For example, a top electrode 148 may be disposed over the OLED 88 and the insulating layer 146, as represented by block 178 of FIG. 7. Specifically, the OLED 88 may emit light when current flows between the pixel electrode 140 and the top electrode 148 (e.g., through the OLED 88). As may be appreciated, the pixel electrode 140 may comprise a transparent material which transmits the light emitted from the OLED 88.

Figure 8:
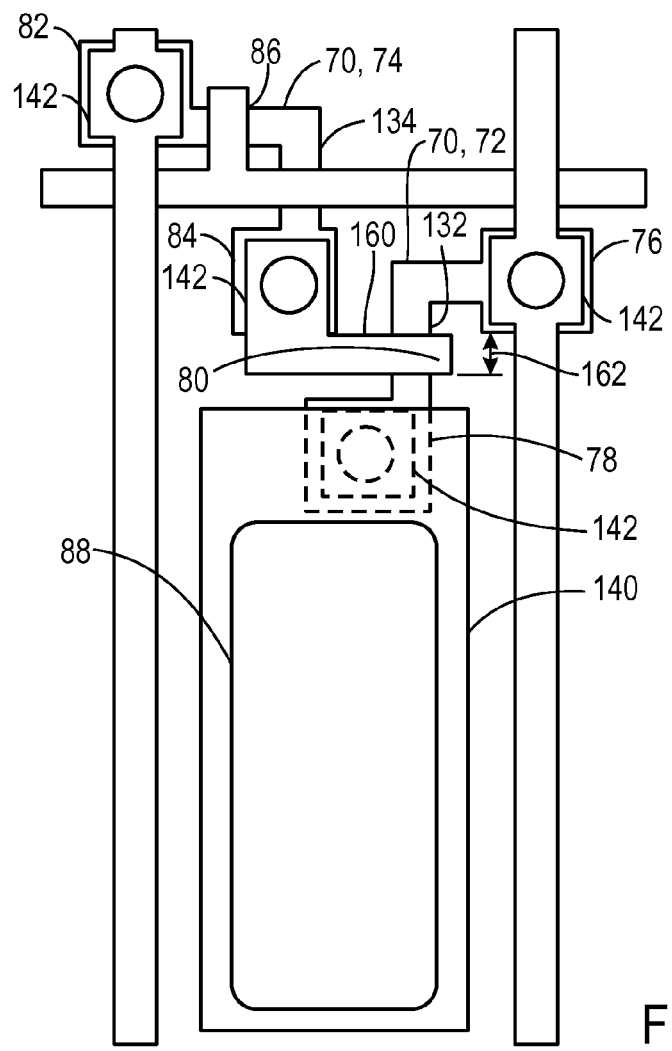
FIG. 8 is a top view of the portion of the AMOLED display having the driving TFT of FIG. 7, in accordance with an embodiment of the disclosure.

As mentioned above, by forming the unit pixel 62 as described in FIGS. 6 and 7, the pixel aperture ratio may be increased as compared to other designs where circuitry connecting the circuit switching TFT 74 and the driving TFT 72 is disposed in different layers of the unit pixel 62. FIG. 8 illustrates a top view of the unit pixel 62 shown in FIG. 6. As illustrated, the drain 84 of the circuit switching TFT 74 is electrically coupled to the gate 80 of the driving TFT 72. As discussed above, the gate 80 is disposed over the ILD 138. In contrast, the gate 86 is disposed beneath the ILD 138. The formation of the gate 80 over the ILD 138 may facilitate a connection 160 of the gate 80 to the drain 84 using the contact 142 and the via 144. As mentioned above, the connection 160 may be formed in the same manufacturing step as the gate 80, the contacts 142, and the vias 144 to reduce manufacturing steps. The connection 160 has a width 162 that may be reduced by forming the connection 160 in the same layer as the gate 80, eliminating additional connection circuitry. For a given unit pixel 62, reducing the width 162 may facilitate more area for the pixel electrode 140 and the OLED 88 of the display 10, which may, in turn, increase the aperture ratio of the display 10.

Figure 9:
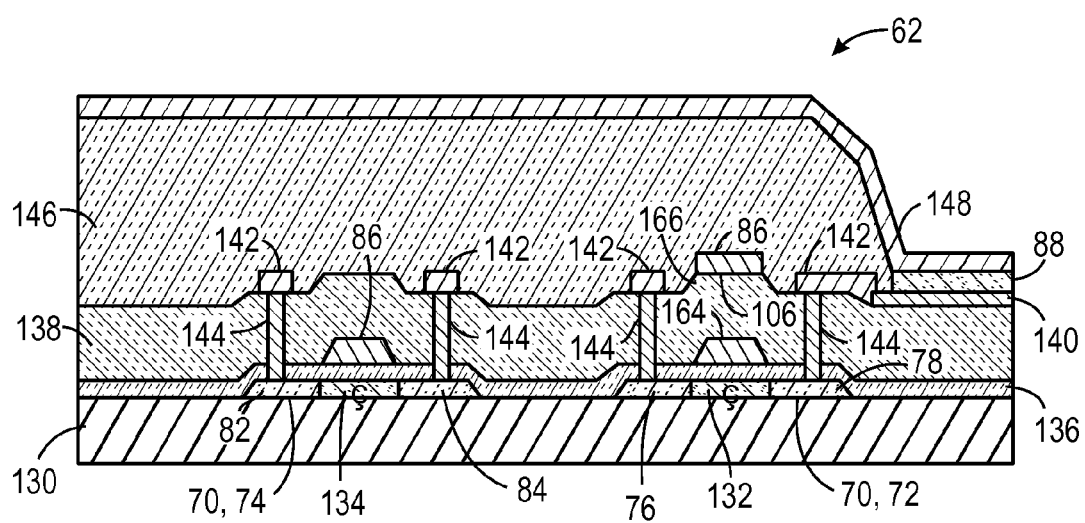
FIG. 9 is a cross-sectional view of a portion of an AMOLED display having a driving TFT with a floating gate, in accordance with an embodiment of the disclosure.

Other embodiments and variations of the embodiments mentioned above may have additional features. For example, FIG. 9 illustrates a cross-sectional view of another embodiment of a unit pixel 62 of the display 10. In this embodiment, a dummy gate electrode 164 is disposed over the gate insulator 136 and over the channel 132 of the driving TFT 72. The dummy gate electrode 164 may act as a doping mask, allowing the source 76 and the drain 78 of the driving TFT 72 to be doped without using a photo resist layer to form a mask. Using the dummy gate electrode 164 as a doping mask may reduce the number of fabrication steps of manufacturing the TFTs 70 of the display 10. The ILD 138 may also include a raised portion 166 to increase the thickness of the ILD 138 over the dummy gate electrode 164.

Figure 10:
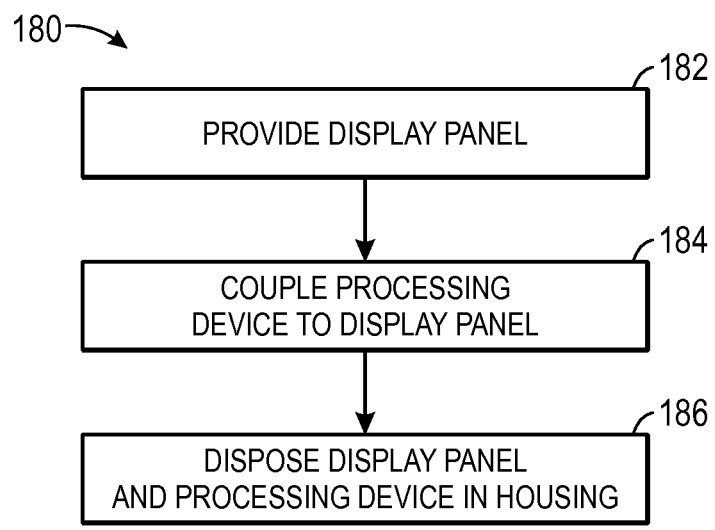
FIG. 10 is a flowchart of a process for manufacturing an AMOLED display.

A matrix of unit pixels 62 including TFTs 70 manufactured as described above may be manufactured into a display 10 to be used the electronic device 8. FIG. 10 illustrates a flowchart 180 of a process for manufacturing an AMOLED display. The matrix of unit pixels 62 may be formed, as described above, to provide the display panel 60, as represented by block 182. The display panel 60 may include multiple unit pixels 62 arranged in rows and columns, as illustrated in FIG. 4. The processor 16 (e.g., processing device) may be coupled to the display panel 60, as represented by block 184. Furthermore, the display panel 60 and the processor 16 may be disposed in a housing of the electronic device 8, as represented by block 186.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display for an electronic device comprising: an array of pixels, each pixel comprising:
a portion of a first thin-film transistor (TFT) disposed over a substrate, wherein the portion of the first TFT comprises a first source, a first drain, and a first channel disposed adjacent to the first source and the first drain;
a portion of a second TFT disposed over the substrate, wherein the portion of the second TFT comprises a second source, a second drain, and a second channel disposed adjacent to the second source and the second drain;
a first via directly and electrically coupled to the first drain of the first TFT;
a first insulator layer disposed over the portion of the first TFT and the portion of the second TFT;
a first gate of the first TFT disposed over the first insulator layer;
a second insulator layer disposed over the first insulator layer and the first gate of the first TFT;
a contact disposed over the second insulator layer and directly and electrically coupled to the via;
and a second gate of a second TFT disposed over the second insulator layer and directly and electrically coupled to the contact;
wherein the deposition of the second gate of the TFT over the second insulator layer reduces a capacitance between the second gate and the second channel;
wherein an accuracy of a gray level control of the pixel is increased due to the reduced capacitance; and
wherein the deposition of the contact and the second gate of the TFT over the second insulator layer reduces a width of the electrical coupling between the contact and the second gate, thereby allowing an increased pixel aperture ratio.

2. The display of claim 1, comprising a third insulator layer disposed over the second gate of the second TFT.

3. The display of claim 1, comprising a second via directly coupled to the second source and extending through the first insulator layer and the second insulator layer.

4. The display of claim 1, comprising a pixel electrode disposed over the second insulator layer.

5. The display of claim 1, comprising a conductor configured to electrically couple the second drain to a pixel electrode.

6. The display of claim 1, comprising an organic light emitting diode (OLED) layer disposed over the second insulator layer.

7. The display of claim 1, comprising a top electrode layer disposed over the second insulator layer.

8. An electronic display comprising:
a matrix of pixels, each pixel comprising:
a portion of a driving thin-film transistor (TFT) comprising a first source, a first drain, and a first channel;
a portion of a circuit TFT comprising a second source, a second drain, and a second channel;
a via directly and electrically coupled to the second drain;
a gate insulator layer disposed over the portion of the driving TFT and the portion of the circuit TFT;
a dummy gate electrode of the driving TFT and a first gate of the circuit TFT disposed over the gate insulator layer;
an interlayer dielectric (ILD) disposed over the dummy gate electrode and the first gate of the circuit TFT;
a contact disposed directly over the ILD and directly and electrically coupled to the via;
a gate of the driving TFT disposed over the ILD; and
a connection formed between the gate of the driving TFT and the contact and disposed over the ILD, wherein the deposition of the connection over the ILD reduces a width of the connection, thereby allowing an increased pixel aperture ratio of the pixel;
wherein the gate of the driving TFT is directly and electrically coupled to the second drain of the circuit TFT and the contact;
whereby the circuit TFT is configured to control an activation and a deactivation of the driving TFT; and
wherein a first height between the gate of the driving TFT and the first channel is larger than a second height between the gate of the circuit switching TFT and the second channel.

9. The electronic display of claim 8, comprising an insulator layer disposed over the gate of the driving TFT and the ILD.

10. The electronic display of claim 8, comprising a pixel electrode disposed over the ILD and electrically coupled to the first drain.

11. The electronic display of claim 8, comprising an organic light emitting diode (OLED) layer disposed over the ILD.

12. The electronic display of claim 8, comprising a top electrode layer disposed over the ILD.

13. The electronic display of claim 8, wherein the electronic display is an active matrix organic light emitting diode display.

14. A display comprising:
an array of pixels, each pixel comprising:
a portion of a first driving TFT and a portion of a circuit TFT comprising a drain disposed over a substrate;
a via directly and electrically coupled to the drain of the circuit TFT;
a gate insulator layer disposed over the portion of the first driving TFT and the portion of the circuit TFT;
a gate of the circuit TFT disposed over the gate insulator layer;
an inter-layer dielectric (ILD) disposed over the gate insulator layer and the gate of the circuit TFT;
a contact directly disposed over the ILD and directly and electrically coupled to the via; and
a gate of the first driving TFT disposed over the ILD and directly and electrically coupled to the drain of the circuit TFT by the contact and the via;
wherein the deposition of the gate of the first driving TFT over the ILD reduces a capacitance between the gate of the first driving TFT and the portion of the first driving TFT;
wherein an accuracy of a gray level control of the pixel is increased due to the reduced capacitance; and wherein the deposition of the contact and the gate of the first driving TFT over the ILD reduces a width of the electrical coupling between the contact and the gate of the first driving TFT, thereby allowing an increased pixel aperture ratio.

15. The display of claim 14, comprising an insulator layer disposed over the ILD and the gate of the driving TFT.

16. The display of claim 14, comprising a pixel electrode disposed over the ILD and is electrically coupled to a drain of the driving TFT.

17. The display of claim 14, comprising an organic light emitting diode (OLED) layer disposed over the ILD.

18. The display of claim 14, comprising a top electrode layer disposed over the ILD.

19. A method comprising:
disposing a portion of a first driving TFT and a portion of a circuit TFT comprising a drain over a substrate;
disposing a gate insulator layer over the portion of the first driving TFT and the portion of the circuit TFT;
disposing a gate of the circuit TFT over the gate insulator layer;
disposing a via over the portion of the circuit TFT;
directly and electrically coupling the via to the drain of the circuit TFT;
disposing an interlayer dielectric (ILD) over the gate insulator layer and the gate of the circuit TFT, wherein the via is configured to extend through the ILD;
disposing a contact directly over the ILD;
directly and electrically coupling the contact to the via;
disposing a gate of the first driving TFT over a portion of the ILD;
directly and electrically coupling the gate of the first driving TFT to the contact; and
electrically coupling an organic light emitting diode (OLED) layer to the first driving TFT;
wherein the deposition of the gate of the first driving TFT over the portion of the ILD increases an accuracy of a gray level control of a pixel comprising the first driving TFT, the circuit TFT, the gate insulator layer, the ILD, and the OLED layer; and
wherein the deposition of the contact and the gate of the first driving TFT over the ILD reduces the width of the electrical coupling between the contact and the gate of the first driving TFT, thereby allowing an increased pixel aperture ratio of the pixel.

20. The method of claim 19, comprising disposing a pixel electrode over the ILD layer, wherein the pixel electrode is electrically coupled to a drain of the driving TFT and to the OLED layer.

21. The method of claim 20, comprising disposing an insulator layer over the ILD, the gate of the driving TFT, and the pixel electrode.

22. The method of claim 21, comprising disposing a top electrode layer extending over the OLED layer and the insulator layer.

23. An apparatus, comprising:
a display panel, wherein the display panel comprises a plurality of unit pixel comprising:
a portion of a first thin-film transistor (TFT) disposed over a substrate, wherein the portion of the TFT comprises a first source, a first drain, and a first channel disposed adjacent to the first source and the first drain;
a portion of a second TFT disposed over the substrate, wherein the portion of the second TFT comprises a second source, a second drain, and a second channel disposed adjacent to the second source and the second drain;
a first insulator layer disposed over the portion of the first TFT and the portion of the second TFT;
a gate of the second TFT disposed over the first insulator layer;
a second insulator layer disposed over the first insulator layer and the gate of the second TFT;
a via directly and electrically coupled to the second drain of the second TFT, wherein the via is configured to extend through the first and second insulator layers;
a contact disposed over the second insulator layer and directly and electrically coupled to the via; and
a gate of the first TFT disposed over the second insulator layer and directly and electrically coupled to the contact disposed over the second insulator layer and the via, thereby reducing a width of the connection and allowing an increased a pixel aperture ratio of the pixel;
a processing device coupled to the display panel; and
a housing comprising the display panel and the processing device.

24. The apparatus of claim 23, comprising a top electrode layer disposed over the second insulator layer.

* * * * *